United States Patent
Sasaki

(10) Patent No.: US 8,597,463 B2
(45) Date of Patent: Dec. 3, 2013

(54) INDUCTIVELY COUPLED PLASMA PROCESSING APPARATUS

(75) Inventor: Kazuo Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 911 days.

(21) Appl. No.: 12/686,756

(22) Filed: Jan. 13, 2010

(65) Prior Publication Data

US 2010/0175831 A1 Jul. 15, 2010

(30) Foreign Application Priority Data

Jan. 14, 2009 (JP) ................. 2009-005843
Jun. 22, 2009 (JP) ................. 2009-147190
Dec. 2, 2009 (JP) ................. 2009-274433

(51) Int. Cl.
*C23C 16/00* (2006.01)
*H01L 21/306* (2006.01)

(52) U.S. Cl.
USPC .............. 156/345.48; 118/723 I; 118/723 AN

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,589,737 A * | 12/1996 | Barnes et al. | 315/111.21 |
| 6,028,395 A * | 2/2000 | Holland et al. | 315/111.51 |
| 6,136,139 A | 10/2000 | Ishii et al. | |
| 6,331,754 B1 * | 12/2001 | Satoyoshi et al. | 315/111.51 |
| 6,905,625 B2 * | 6/2005 | Okumura et al. | 216/67 |
| 2002/0002947 A1 | 1/2002 | Satoyoshi et al. | |
| 2002/0108933 A1 * | 8/2002 | Hoffman et al. | 219/121.43 |
| 2004/0074609 A1 | 4/2004 | Fischer et al. | |
| 2006/0137611 A1 * | 6/2006 | Choe et al. | 118/723.001 |

FOREIGN PATENT DOCUMENTS

| | | |
|---|---|---|
| CN | 1794431 A | 6/2006 |
| JP | 10-189296 A | 7/1998 |
| JP | 10-284299 A | 10/1998 |
| JP | 3077009 | 6/2000 |
| JP | 2001-110777 A | 4/2001 |
| JP | 2002-033311 A | 1/2002 |
| JP | 2003-264172 | 9/2003 |

(Continued)

OTHER PUBLICATIONS

Chinese Office Action issued Sep. 15, 2011, in Patent Application No. 201010003194.2 (with English-language Translation).

(Continued)

*Primary Examiner* — Luz Alejandro Mulero
(74) *Attorney, Agent, or Firm* — Oblon, Spivak, McClelland, Maier & Neustadt, L.L.P.

(57) ABSTRACT

An inductively coupled plasma processing apparatus includes a processing chamber for accommodating a target substrate to be processed and performing plasma processing thereon, a mounting table provided in the processing chamber for mounting thereon the target substrate, a processing gas supply system for supplying a processing gas into the processing chamber and a gas exhaust system for exhausting the inside of the processing chamber. Further, in the inductively coupled plasma processing apparatus, a high frequency antenna is provided to form an inductive electric field in the processing chamber and a first high frequency power supply is provided to supply a high frequency power to the high frequency antenna. A metal window made of a nonmagnetic and conductive material is formed between the high frequency antenna and the processing chamber while being insulated from a main body which forms the processing chamber.

16 Claims, 15 Drawing Sheets

(56) References Cited

FOREIGN PATENT DOCUMENTS

| | | |
|---|---|---|
| JP | 3609985 | 10/2004 |
| JP | 2005-527976 A | 9/2005 |
| JP | 2005-285564 | 10/2005 |
| JP | 2006-185921 A | 7/2006 |
| JP | 2008-109155 | 5/2008 |
| KR | 10-0418228 | 2/2004 |
| KR | 10-2004-0065319 | 7/2004 |
| KR | 10-2006-0073737 | 6/2006 |
| TW | 473775 B | 1/2002 |

OTHER PUBLICATIONS

Office Action issued May 24, 2011, in Korean Patent Application No. 10-2010-0003288 (with English-language translation).

\* cited by examiner

INDUCTIVELY COUPLED PLASMA PROCESSING APPARATUS

CROSS-REFERENCE TO RELATED APPLICATIONS

This application claims priority to Japanese Patent Application Nos. 2009-005843 filed on Jan. 14, 2009; 2009-147190 filed on Jun. 22, 2009 and 2009-274433 filed on Dec. 2, 2009, the entire contents of which are incorporated herein by reference.

FIELD OF THE INVENTION

The present invention relates to an inductively coupled plasma processing apparatus for performing plasma processing on a substrate, e.g., a glass substrate for use in an FPD (Flat Panel Display) such as an LCD (Liquid Crystal Display) or the like.

BACKGROUND OF THE INVENTION

In a process for manufacturing a liquid crystal display (LCD) or the like, a plasma processing apparatus such as a plasma etching apparatus, a plasma CVD film forming apparatus and the like is used to perform a predetermined processing on a glass substrate. Conventionally, a capacitively coupled plasma processing apparatus has been widely used as the plasma processing apparatus. Recently, however, an inductively coupled plasma (ICP) processing apparatus capable of generating a high-density plasma has become an increasingly used technology.

In the inductively coupled plasma processing apparatus, a high frequency antenna is provided outside a dielectric window of a processing chamber for accommodating a target substrate to be processed. In the processing chamber, an inductively coupled plasma is generated by supplying a processing gas to the processing chamber and a high frequency power to the high frequency antenna. By using the inductively coupled plasma thus generated, a predetermined plasma processing is performed on the target substrate. A planar antenna having a predetermined pattern is widely used for the high frequency antenna of the inductively coupled plasma processing apparatus. This is described in Japanese Patent Publication No. 3077009.

Recently, a target substrate to be processed has been increased in size. For example, a rectangular glass substrate for use in an LCD is considerably scaled up from about 1500 mm×1800 mm (short side×long side) to about 2200 mm×2400 mm and further to about 2800 mm×3000 mm.

In the inductively coupled plasma processing apparatus, a dielectric window is inserted between the high frequency antenna and the processing chamber. When the target substrate is scaled up, the dielectric window is also scaled up. However, the dielectric window is generally made of quartz glass or ceramic, as described in Japanese Patent Publication No. 3077009.

Since quartz or ceramic is brittle, it is not suitable for the scaling up of the dielectric window. Japanese Patent Publication No. 3609985 discloses a technique for dividing quartz glass in order to scale up the dielectric window.

However, as the target substrate has increased in size markedly, it has become more difficult to apply the technique for dividing the dielectric window disclosed in Japanese Patent Publication No. 3609985.

SUMMARY OF THE INVENTION

In view of the above, the present invention provides an inductively coupled plasma processing apparatus capable of dealing with a target substrate to be processed of a larger size.

In accordance with an aspect of the present invention, there is provided an inductively coupled plasma processing apparatus including: a processing chamber for accommodating a target substrate to be processed and performing plasma processing thereon; a mounting table provided in the processing chamber, for mounting thereon the target substrate; a processing gas supply system for supplying a processing gas into the processing chamber; a gas exhaust system for exhausting the inside of the processing chamber; a high frequency antenna for forming an inductive electric field in the processing chamber; a first high frequency power supply for supplying a high frequency power to the high frequency antenna, wherein a metal window made of a nonmagnetic and conductive material is formed between the high frequency antenna and the processing chamber while being insulated from a main body which forms the processing chamber.

In accordance with the present invention, it is possible to provide an inductively coupled plasma processing apparatus capable of dealing with a target substrate to be processed of a larger size.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

(First Embodiment)

Figure 1:
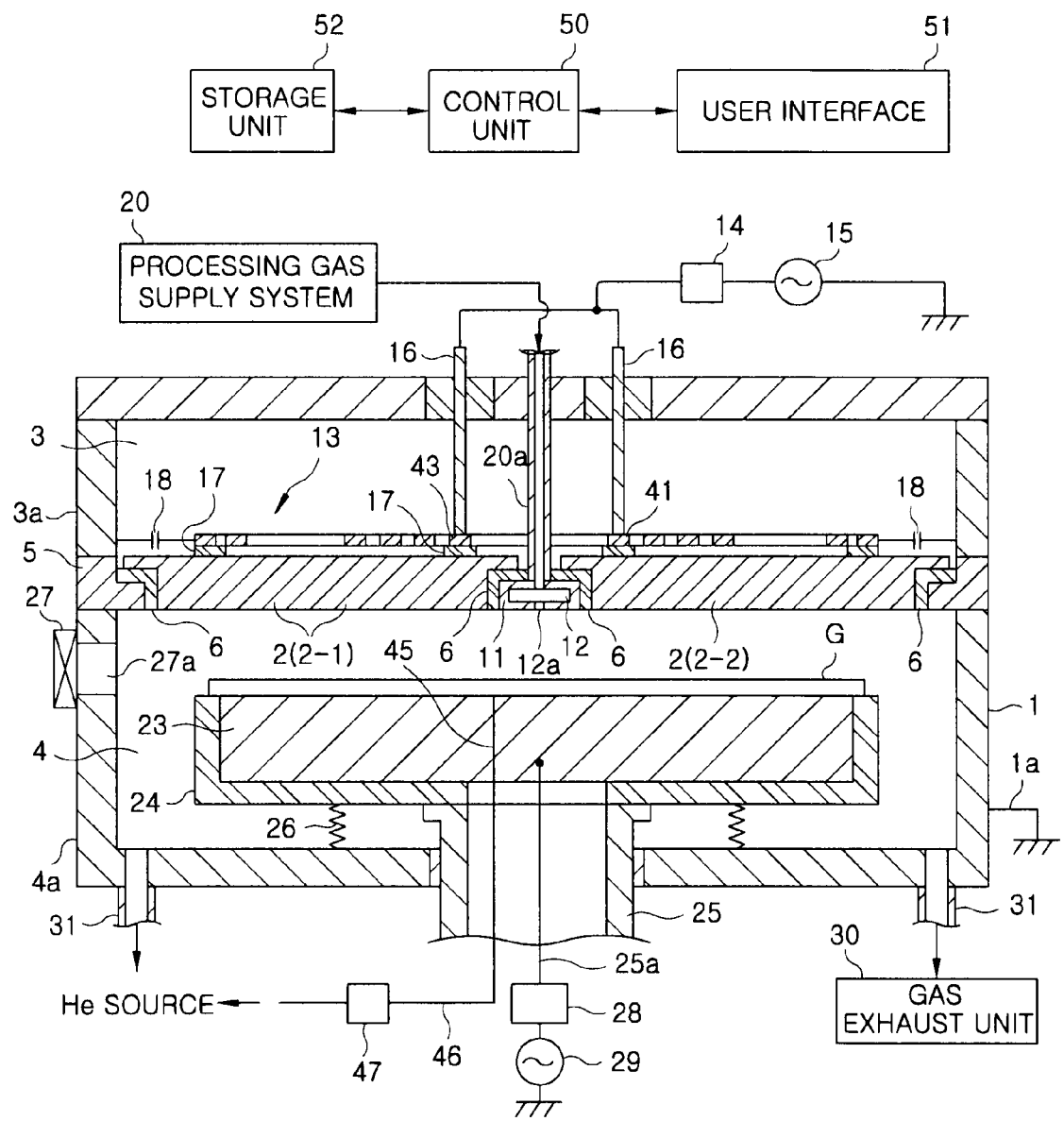
FIG. 1 is a schematic cross sectional view of an inductively coupled plasma processing apparatus in accordance with a first embodiment of the present invention.
Figure 2:
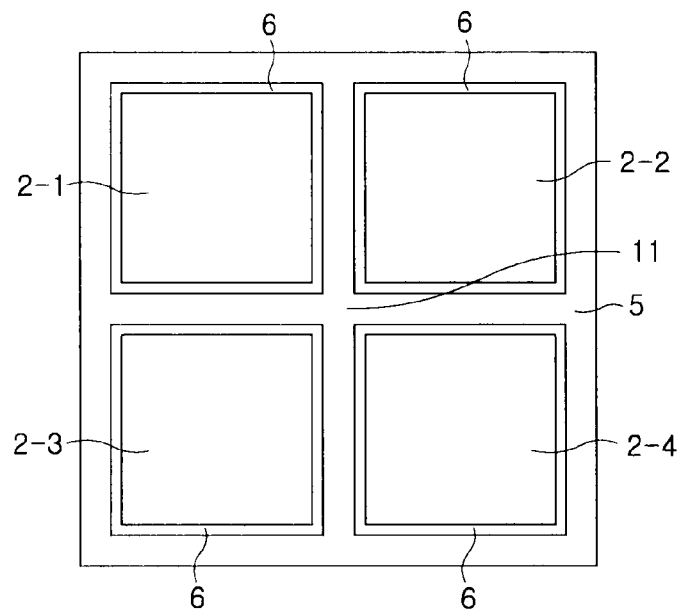
FIG. 2 is a top view of an example of a nonmagnetic conductive metal window used in the inductively coupled plasma processing apparatus in accordance with the first embodiment.
Figure 3:
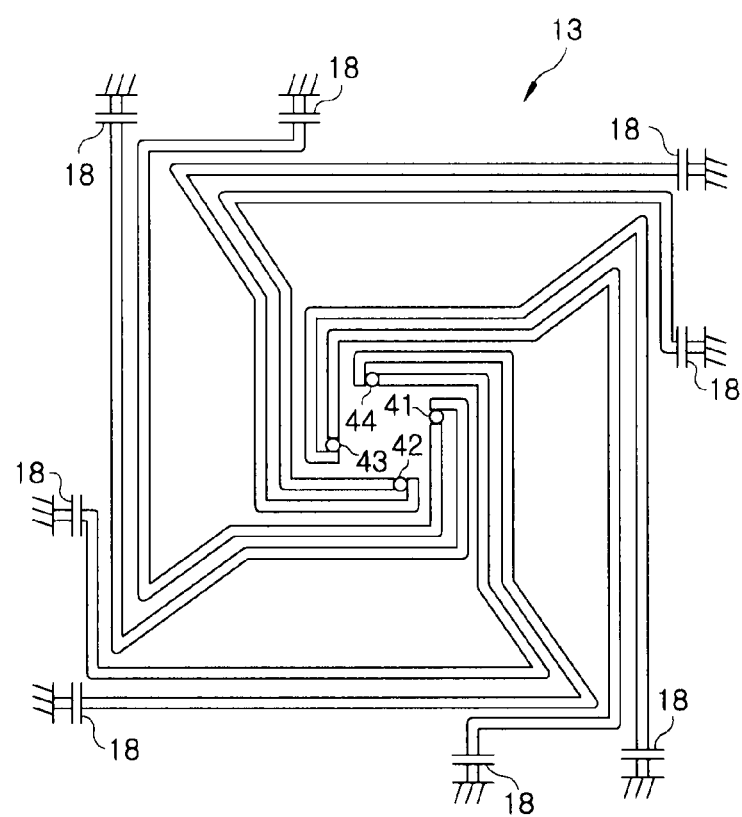
FIG. 3 is a top view of an example of a high frequency antenna used in the inductively coupled plasma processing apparatus in accordance with the first embodiment.

FIG. 1 is a schematic cross sectional view of an inductively coupled plasma processing apparatus in accordance with a first embodiment of the present invention. FIG. 2 is a top view of an example of a nonmagnetic conductive metal window used in the inductively coupled plasma processing apparatus in accordance with the first embodiment. FIG. 3 is a top view of an example of a high frequency antenna used in the inductively coupled plasma processing apparatus in accordance with the first embodiment. This apparatus is used for ashing a resist film or etching an oxide film, an ITO film, or a metal film in forming a thin film transistor on a glass substrate for use in an FPD for example. Herein, the FPD includes, e.g., a liquid crystal display (LCD), an electro luminescence (EL) display, a plasma display panel (PDP) or the like.

This plasma processing apparatus includes a square-column-shaped airtight main body 1 made of a conductive material, e.g., aluminum, an inner surface of which is anodially oxidized (alumite treated). The main body 1 is grounded via a ground wire 1a. Further, the main body 1 is horizontally partitioned into an antenna chamber 3 and a processing chamber 4 by a metal window 2 electrically insulated from the main body 1. In this example, the metal window 2 forms a ceiling wall of the processing chamber 4. This metal window 2 is made of, e.g., a nonmagnetic conductive metal. An example of the nonmagnetic conductive metal is aluminum or alloy containing aluminum.

Provided between a sidewall 3a of the antenna chamber 3 and a sidewall 4a of the processing chamber 4 in the main body 1 are a support shelf 5 projecting toward the inside of the main body 1 and a cross-shaped supporting beam 11 serving as a shower housing for supplying a processing gas. When the supporting beam 11 serves as the shower housing, a gas channel 12 extending in a direction parallel to a target surface of a target substrate to be processed G is formed inside the supporting beam 11 and communicates with a plurality of gas injection openings 12a for injecting the gas toward the processing chamber 4.

Further, a gas supply line 20a is provided above the supporting beam 11 so as to communicate with the gas channel 12. The gas supply line 20a penetrates through the ceiling of the main body 1, and is connected to a processing gas supply system 20 including a processing gas supply source, a valve system and the like. Accordingly, during the plasma processing, the processing gas is supplied from the processing gas supply system 20 to the supporting beam 11 through the gas supply line 20a, and then is injected into the processing chamber 4 through the gas injection openings 12a.

The supporting shelf 5 and the supporting beam 11 are made of a conductive material, preferably metal, e.g., aluminum.

In this example, the metal window 2 is divided into four sections 2-1 to 2-4 as shown in FIG. 2. These four metal windows 2-1 to 2-4 are mounted on the supporting shelf 5 and the supporting beam 11 via insulators 6. In this example, a wall of the processing chamber 4 which faces oppositely to the mounting table 23 has a rectangular shape, so that the metal window 2 is divided into the four metal windows 2-1 to 2-4 along lines connecting the center of the rectangle with respective middle points of the sides of the rectangle. That is, the metal windows 2-1 to 2-4 obtained by dividing the metal window 2 into four rectangular sections are mounted on the supporting shelf 5 and the supporting beam 11 via the insulators 6, and thus are insulated from the supporting shelf 5, the supporting beam 11 and the main body 1. Moreover, the metal windows 2-1 to 2-4 are insulated from each other. The insulators 6 may be, e.g., ceramic or polytetrafluoroethylene (PTFE).

In the antenna chamber 3, a high frequency (RF) antenna 13 is disposed above the metal window 2 so as to face the metal window 2, and is spaced apart from the metal window 2 by a spacer 17 made of an insulating material. Further, the high frequency antenna 13 is formed like a spiral as illustrated in FIG. 3, and the metal window 2 is divided along lines extending radially from the center of the spiral.

During the plasma processing, a high frequency power having a frequency of, e.g., 13.56 MHz, for generating an inductive electric field is supplied from a first high frequency power supply 15 to the high frequency antenna 13 via power feed members 16. The high frequency antenna 13 in this example has four power feed portions 41 to 44 connected to the power feed members 16. The four power feed portions are arranged at substantially the same diametrical distance about the center thereof while spacing apart from each other by angular distance of about 90°. Two antenna lines extend from each of the power feed portions 41 to 44 to the outside. End portions of the antenna lines are connected to the capacitors 18, and the antenna lines are grounded via the capacitors 18.

By applying the high frequency power to the high frequency antenna 13, the inductive electric field is generated in the processing chamber 4, and the processing gas supplied from the gas injection openings 12a is turned into a plasma by the inductive electric field.

A mounting table 23 for mounting thereon the target substrate G, e.g., an LCD glass substrate, is provided at a lower portion of the processing chamber 4 located oppositely to the high frequency antenna 13 while the metal window 2 is disposed therebetween. The mounting table 23 is made of a conductive material, e.g., aluminum having an anodically oxidized surface. The target substrate G (not shown) mounted on the mounting table 23 is attracted to be held on an electrostatic chuck (not shown).

The mounting table 23 is accommodated in an insulating frame 24 and supported by a hollow support 25. The support 25 penetrates through the bottom portion of the main body 1 while maintaining the airtightness, and is supported by an elevation mechanism (not shown) provided outside the main body 1. The mounting table 23 is vertically moved by the elevation mechanism during loading and unloading of the target substrate G. In addition, a bellows 26 is disposed between the insulating frame 24 and the bottom portion of the main body 1 to airtightly surround the support 25. Accordingly, the airtightness in the processing chamber 4 is ensured in spite of the vertical movement of the mounting table 23. Formed on the sidewall 4a of the processing chamber 4 are a loading/unloading port 27a for loading and unloading the target substrate G and a gate valve 27 for opening and closing the loading/unloading port 27a.

A second high frequency power supply 29 is connected to the mounting table 23 via a matching unit 28 by a power feed line 25a provided in the hollow support 25. The second high frequency power supply 29 supplies a high frequency bias power having a frequency of, e.g., 3.2 MHz, to the mounting table 23 during the plasma processing. Due to the application of the high frequency bias power, ions in the plasma generated in the processing chamber 4 are effectively attracted to the substrate G.

Further, in order to control the temperature of the substrate G, the mounting table 23 is provided with a temperature sensor and a temperature control mechanism including a coolant flow path, a heating unit such as a ceramic heater or the like (all not shown). The lines or wirings for the mechanism and the members pass through the hollow support 25 and are extracted out of the main body 1.

A gas exhaust unit 30 including a vacuum pump and the like is connected to the bottom portion of the processing chamber 4 through the gas exhaust line 31. The processing chamber 4 is exhausted by the gas exhaust unit 30, and set and maintained at a predetermined vacuum atmosphere (e.g., about 1.33 Pa) during the plasma processing.

Formed on the backside of the target substrate G mounted on the mounting table 23 are a cooling space (not shown) and a He gas channel 45 for supplying He gas as a heat transfer gas at a constant pressure. The He gas channel 45 is connected to a He gas line 46, and is also connected to a He source (not shown) via a pressure control valve 47.

The components of the plasma processing apparatus are connected to and controlled by a control unit 50 having a computer. Further, the control unit 50 is connected to a user interface 51 having a keyboard on which a process operator inputs commands to operate the plasma processing apparatus, a display for visually displaying the operation status of the plasma processing apparatus and the like. Moreover, the control unit 50 is connected to a storage unit which stores recipes such as control programs for implementing various processes executed by the plasma processing apparatus under the control of the control unit 50 or programs for operating each component of the plasma processing apparatus based on the processing conditions.

The recipes may be stored in a hard disk or a semiconductor memory, or may be set in a predetermined position of the storage unit 52 while the storage unit is stored in a portable storage medium such as a CD-ROM, a DVD or the like. In addition, the recipes may be transmitted properly from another device via, e.g., a dedicated line. Further, if necessary, a required recipe may be retrieved from the storage unit 52 and executed by the control unit 50 in accordance with instructions from the user interface 51, thereby performing a desired processing in the plasma processing apparatus under the control of the control unit 50.

Figure 4:
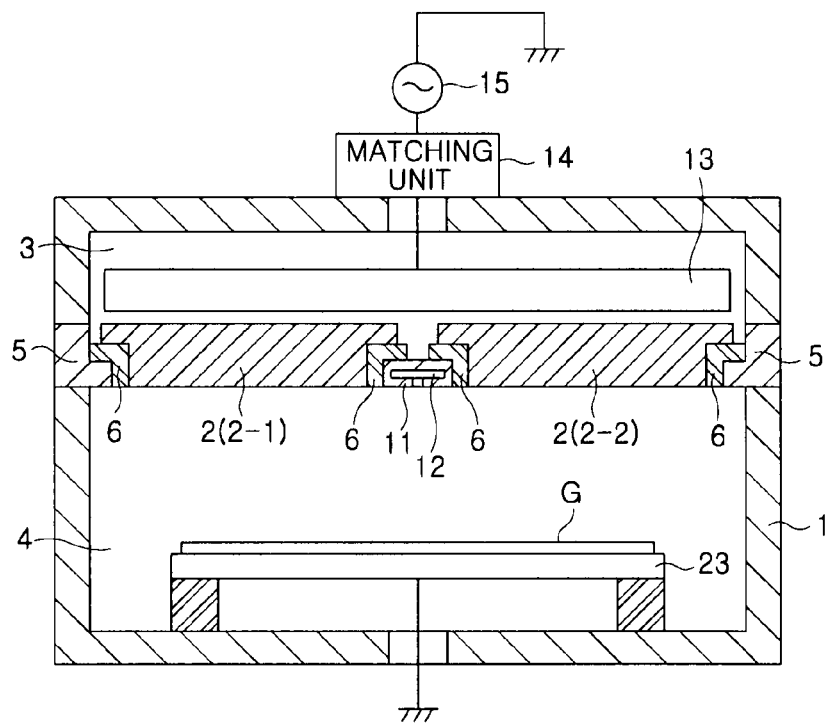
FIG. 4 is a more schematic view of the inductively coupled plasma processing apparatus in accordance with the first embodiment.

In the inductively coupled plasma processing apparatus in accordance with the first embodiment, the metal window 2 made of a nonmagnetic conductive metal, e.g., aluminum or alloy containing aluminum, is used instead of a conventional window made of a dielectric material, e.g., quartz. Accordingly, the metal window 2 has hardness greater than that of the conventional window made of a dielectric material, e.g., quartz, and this makes it possible to deal with the target substrate of a larger size. FIG. 4 shows a more simplified schematic configuration than that shown in FIG. 1.

Figure 5:
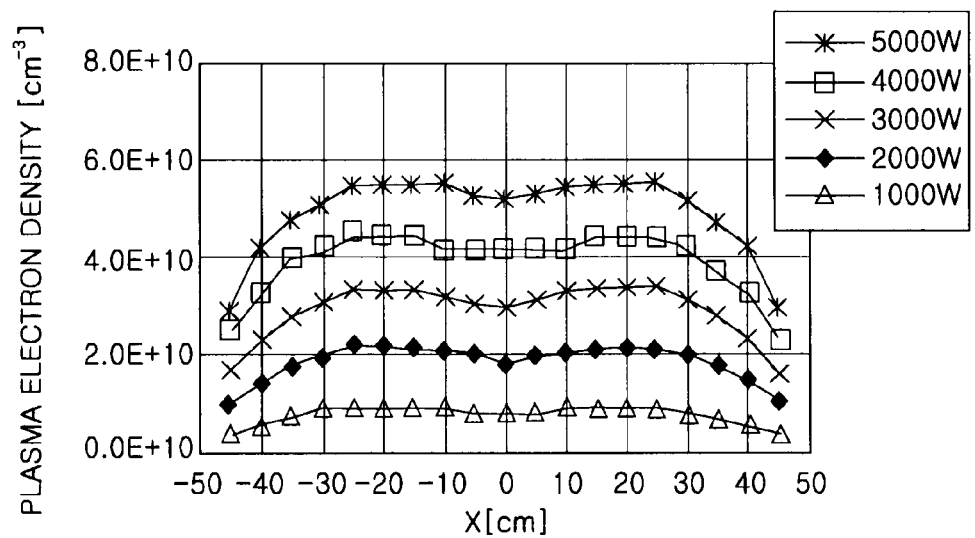
FIG. 5 illustrates a plasma electron density obtained in the inductively coupled plasma processing apparatus in accordance with the first embodiment.

FIG. 5 shows a measurement result of the plasma electron density along the lines connecting the center of the target substrate G and the middle points of the short sides of the target substrate G in the inductively coupled plasma processing apparatus shown in FIG. 1 or 4.

As shown in FIG. 5, when the power is about 5000 W, the high-density plasma having a plasma electron density of about $6 \times 10^{10}$ cm$^{-3}$ is generated at the central portion (X=0) and the vicinity thereof.

Figure 6:
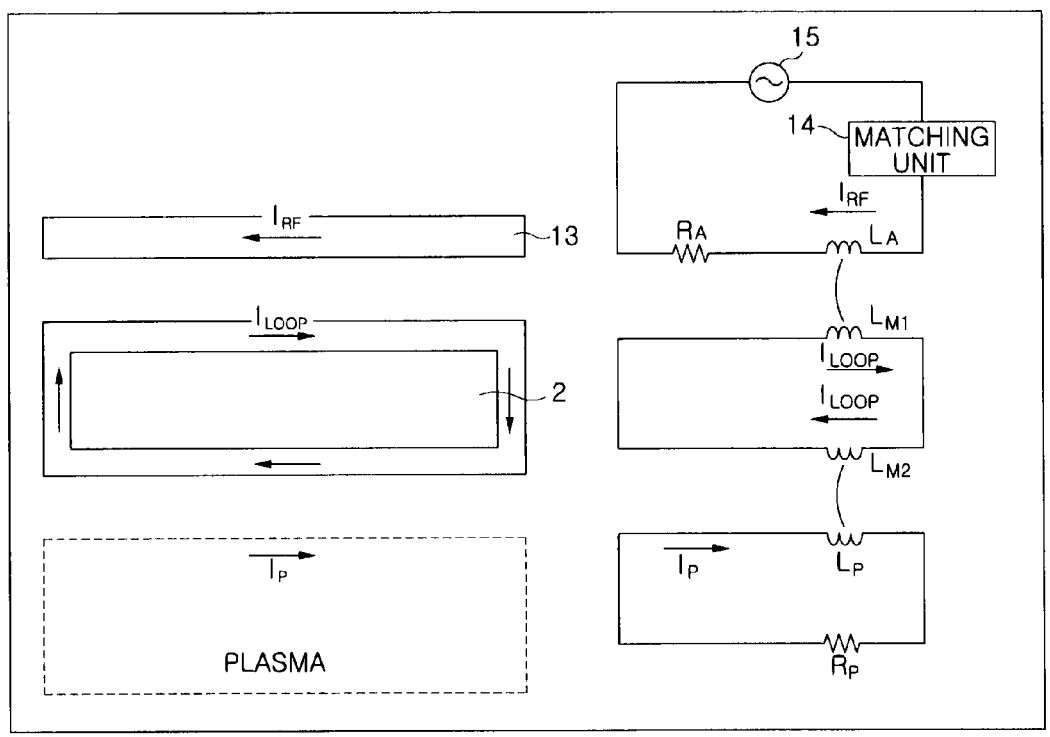
FIG. 6 shows a conjectured mechanism of plasma generation.

FIG. 6 shows a conjectured mechanism of such plasma generation.

Figure 7:
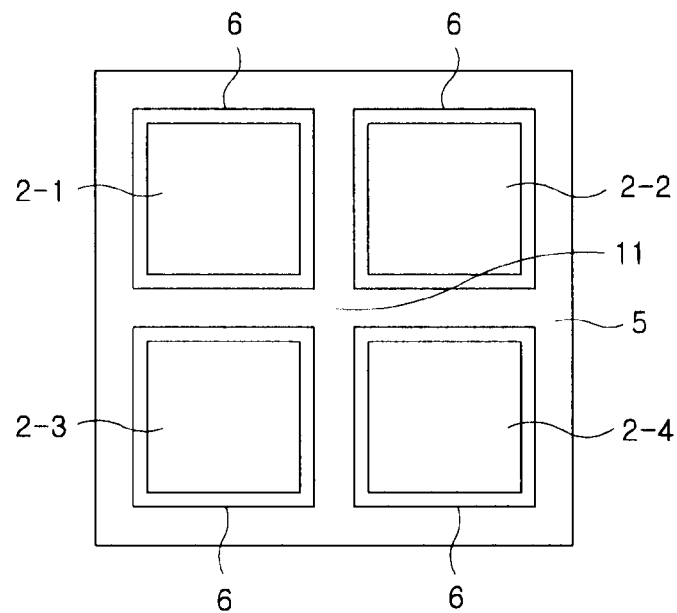
FIG. 7 is a top view showing an example of a metal window divided into four sections.
Figure 8:
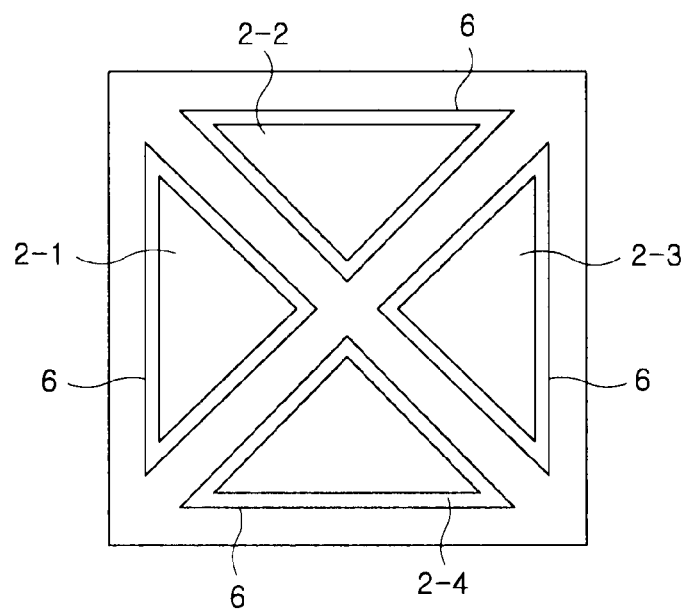
FIG. 8 is a top view of another example of the metal window divided into four sections.

As can be seen from FIG. 6, an eddy current $I_{LOOP}$ is generated on the top surface of the metal window 2 (the surface exposed to the high frequency antenna) by a current $I_{RF}$ flowing through the high frequency antenna 13. The metal window 2 is insulated from the supporting shelf 5, the supporting beam 11 and the main body 1. Therefore, the eddy current $I_{LOOP}$ flows through the top surface, the side surface, and the bottom surface (the surface exposed to the processing chamber) of the metal window 2 and returns to the top surface of the metal window 2 through the other side surface thereof. That is, the eddy current $I_{LOOP}$ circulates in a loop from the top surface of the metal window 2 (the surface exposed to the high frequency antenna) to the bottom surface of the metal window 2 (the surface exposed to the processing chamber). An inductive electric field is generated in the processing chamber 4 by the eddy current $I_{LOOP}$ flowing through the bottom surface of the metal window 2. Due to the inductive electric field generated in the processing chamber 4, the gas in the processing chamber 4 is excited and turned into a plasma. The mechanism of the plasma generation is conjectured as described above. Moreover, the surface (about a few cm) of the plasma generated in the processing chamber 4 is inductively heated by the eddy current $I_{LOOP}$ flowing through the bottom surface of the metal window 2, so that the high-density plasma is generated. FIG. 7 illustrates an example of a plane shape of the metal window divided into four sections, and FIG. 8 shows another example of a plane shape of the metal window divided into four sections.

Whether the metal window 2 has to be divided or not is determined based on a plane shape of the high frequency antenna 13. For example, when the high frequency antenna 13 has a spiral plane shape as shown in FIG. 3 or an annular plane shape, the metal window 2 is divided along lines extending radially from the center of the high frequency antenna 13 having the spiral or the annular, as can be seen from FIG. 7 or 8. In the case where the high frequency antenna 13 has the spiral plane shape or the annular plane shape, if the metal window 2 is formed of a single plate, the eddy current $I_{LOOP}$ generated on the top surface of the metal window 2 by the high frequency antenna 13 flows only through the top surface of the metal window 2. In other words, the eddy current $I_{LOOP}$ does not flow through the bottom surface of the metal window 2. For that reason, the metal window 2 needs to be divided into multiple sections, and the divided metal windows 2 need to be insulated from each other.

Figure 9:
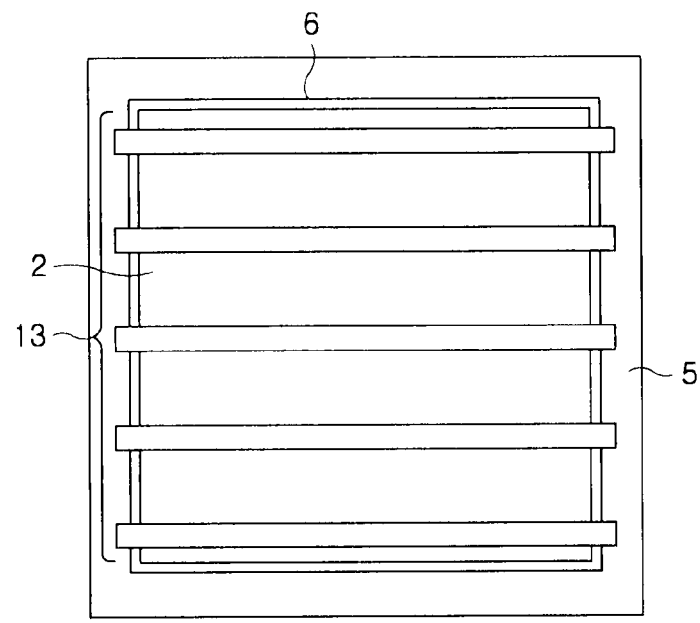
FIG. 9 is a top view illustrating an example of a metal window with a linear high frequency antenna.

On the other hand, when the high frequency antenna 13 has, e.g., a linear shape as shown in FIG. 9, the metal window 2 may be formed of a single plate.

That is, in accordance with the first embodiment, the metal window 2 made of a nonmagnetic conductive material is used instead of the conventional window made of a dielectric material. Thus, the hardness of the window increases, and the inductively coupled plasma processing apparatus capable of dealing with the target substrate in a larger size can be provided.

(First Modification)

In the inductively coupled plasma processing apparatus in accordance with the first embodiment, a dielectric film may be formed on a surface of the metal window 2. An example of the dielectric film includes an anodically oxide film or a thermally sprayed ceramic film.

By forming the anodically oxide film or the thermally sprayed ceramic film on the surface of the metal window 2, at least on the surface exposed to the processing chamber 4, the plasma resistance of the metal window 2 can be improved compared to the case where the metal window 2 made of, e.g., aluminum or alloy containing aluminum, is directly exposed to the processing chamber 4.

(Second Modification)

A dielectric cover may be provided on a surface of the metal window 2 which is exposed to the processing chamber 4. The dielectric cover may be a quartz cover or a ceramic cover. An example of the ceramic includes alumina ceramic.

By covering the surface of the metal window 2 which is exposed to the processing chamber 4, the plasma resistance of the metal window 2 can be improved compared to the case where the metal window 2 made of, e.g., aluminum or alloy containing aluminum, is directly exposed to the processing chamber 4.

(Third Modification)

A nonmagnetic conductive film having a conductivity higher than that of a material forming the metal window 2 may be formed on a surface of the metal window 2. As described above, the loop current $I_{LOOP}$ flows on the surface of the metal window 2. By increasing the conductivity of the surface of the metal window 2, it is possible to improve the efficiency of the generation of the loop current $I_{LOOP}$ by the current flowing in the high frequency antenna 13.

When the metal window 2 is made of aluminum or alloy containing aluminum, the nonmagnetic conductive film may be made of, e.g., copper or alloy containing copper, or silver or alloy containing silver.

In the following, other embodiments to which the first to the third modification can be applied will be described.

(Second Embodiment)

As shown in FIG. 9, when the high frequency antenna 13 has a linear shape, the metal window 2 may be formed of a single plate. In such a case, the supporting beam 11 is not required and, hence, the locations of the gas injection openings 12a can be selected. The gas injection openings 12a may be formed on the sidewall of the main body 1. Since, however, the metal window 2 has better processability compared to a dielectric window made of, e.g., quartz or ceramic, the gas channel 12 and the gas injection openings 12a may be formed at the metal window 2.

Figure 10:
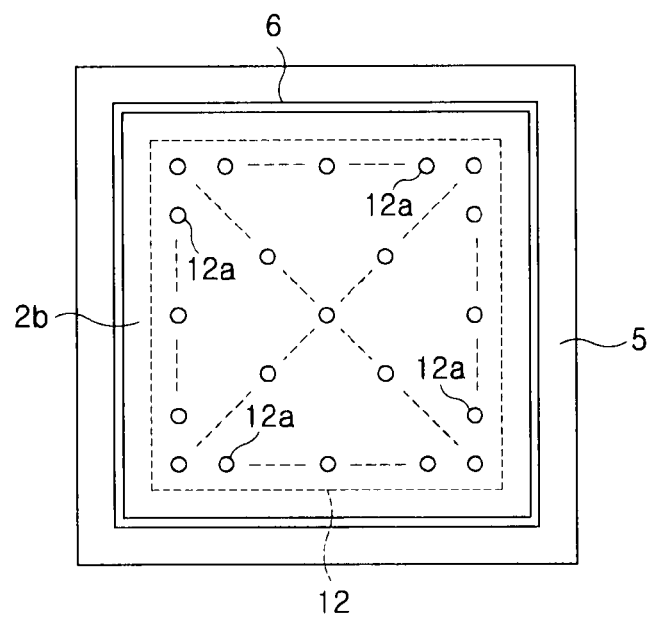
FIG. 10 is a top view of an example of a metal window used in an inductively coupled plasma processing apparatus in accordance with a second embodiment of the present invention.

FIG. 10 offers a top view showing an example of a metal window 2b of the inductively coupled plasma processing apparatus in accordance with the second embodiment.

As shown in FIG. 10, the gas channel 12 is formed at the metal window 2b. In this example, the gas channel 12 is formed by providing a space such as a gas diffusion space of a shower head inside the metal window 2b. The space-like gas channel 12 is connected to the gas supply line 20a shown in FIG. 1, and a processing gas is supplied from the gas supply system 20 of FIG. 1. The processing gas supplied to the gas channel 12 is discharged to the processing chamber 4 through the gas injection openings 12a which communicate with the gas channel 12.

As described above, the gas channel 12 and the gas injection openings 12a can be formed at the metal window 2.

Figure 11:
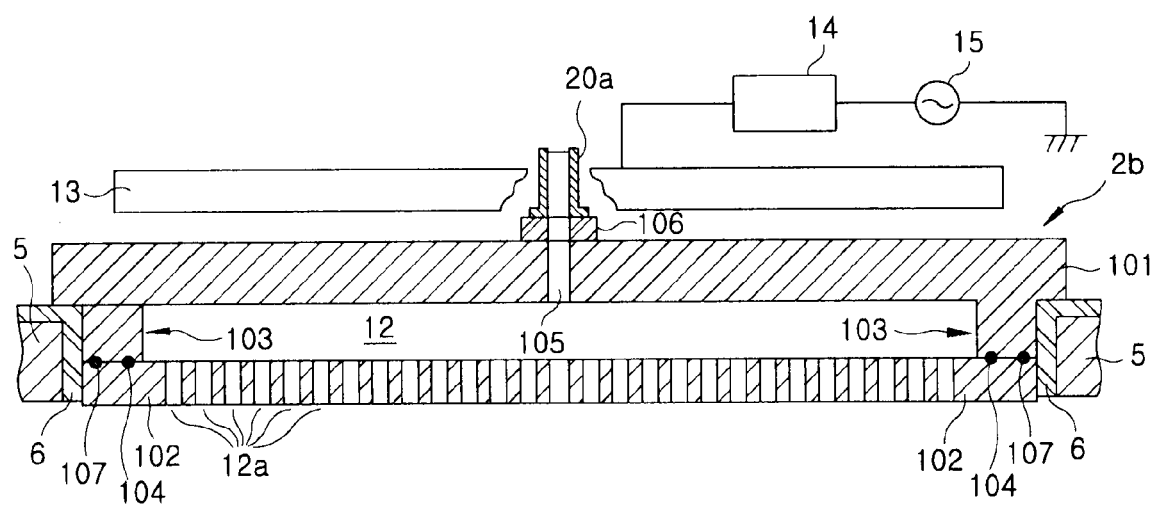
FIG. 11 is a cross sectional view of a specified example of the metal window.

FIG. 11 is a cross sectional view showing an example of a metal window 2b in detail.

As shown in FIG. 11, the metal window 2b includes a shower plate 102 having the gas injection openings 12a communicating with the inside of the processing chamber 4; and a base 101 having a peripheral portion 103 corresponding to a periphery of the shower plate 102 and a recessed portion surrounded by the peripheral portion 103. By attaching the shower plate 102 to the peripheral portion 103, the recessed portion of the base 101 serves as the space-like gas channel 12 similar to a gas diffusion space.

An airtight sealing member 104 is interposed between the shower plate 102 and the peripheral portion 103 to thereby prevent the gas from leaking from the space therebetween. For example, an O-ring is employed as the airtight sealing member 104.

A gas supply hole 105 communicating with the gas channel 12 is formed on the base 101. A gas supply line 20a is connected to the gas supply hole 105 via an insulating member 106. By connecting the gas supply line 20a to the gas supply hole 105 via the insulating member 106, an eddy current $I_{Loop}$ flowing from top to bottom of the metal window 2b can be suppressed from flowing into the gas supply line 20a.

In the metal window 2b, an electric contact member 107 is provided between the shower plate 102 and the peripheral portion 103 to ensure an electric contact therebetween. Specifically, there may develop a fine gap between the shower plate 102 and the peripheral portion 103 since the shower plate 102 is bendable due to the affect of gravity. Especially, the gap may be more easily made when the airtight sealing member such as the O-ring member is interposed between the shower plate 102 and the peripheral portion 103.

Such a gap therebetween may be an obstacle to the flowing of the eddy current $I_{Loop}$ to a bottom surface of the shower plate 102 (a surface exposed to the processing chamber). However, this problem can be solved by providing the electric contact member 107 between the shower plate 102 and the peripheral portion 103 as described above. An extensible and contractible conductive member, for example, can be employed as the electric contact member 107. Specifically, a conductive member that is wound in a spiral form, or a metal of a spiral form, can be employed.

Figure 12:
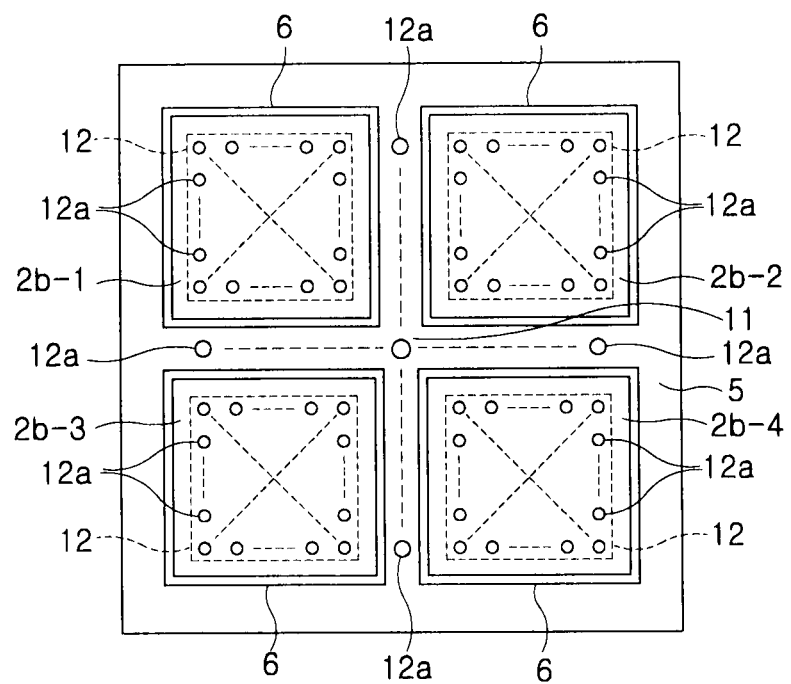
FIG. 12 is a top view of another example of a metal window used in the inductively coupled plasma processing apparatus in accordance with the second embodiment of the present invention.

FIG. 12 provides a top view showing another example of the metal window 2b used in the inductively coupled plasma processing apparatus in accordance with the second embodiment of the present invention.

As shown in FIG. 12, even when the metal window 2b is divided into multiple sections, e.g., four metal windows 2b-1 to 2*b*-4, the gas channel 12 and the gas injection openings 12*a* can be formed at each of the metal windows 2*b*-1 to 2*b*-4.

In the inductively coupled plasma processing apparatus having four metal windows 2*b*-1 to 2*b*-4, the gas injection openings 12*a* are formed at the cross-shaped supporting beam 11 for example. Thus, the gas injection openings 12*a* are arranged in a cross shape with respect to the processing chamber 4, and this makes it difficult to uniformly distribute the processing gas in the processing chamber 4.

To that end, the gas channel 12 and the gas injection openings 12*a* are formed at each of the metal windows 2*b*-1 to 2*b*-4 as shown in FIG. 12. In that case, the gas injection openings 12*a* can be more uniformly arranged with respect to the processing chamber 4 compared to the case where they are formed only at the cross-shaped supporting beam 11.

Moreover, as described above, when the metal window 2*b* is divided into the metal windows 2*b*-1 to 2*b*-4, each of the metal windows 2*b*-1 to 2*b*-4 can have the same configuration as the metal window 2*b* including the base 101 formed with the recessed portion serving as the gas channel 12; and the shower plate 102 formed with the gas injection openings 12*a* as shown in FIG. 11.

In the surface on which the base 101 and the shower plate 102 are brought into contact with each other, for example, between the peripheral portion 103 of the base 101 and the shower plate 102, the electric contact member 107 as the conductive member may be provided to electrically connect the base 101 to the shower plate 102 as shown in FIG. 11.

As such, in the inductively coupled plasma etching apparatus in accordance with the second embodiment, the gas channel 12 and the gas injection openings 12*a* are formed at, e.g., the metal window 2*b* or each of the metal windows 2*b*-1 to 2*b*-4. Therefore, in addition to the effect of the first embodiment, the gas injection openings 12*a* can be uniformly arranged with respect to the processing chamber 4 to thereby facilitate uniform distribution of processing gas inside the processing chamber 4.

(Third Embodiment)

Figure 13:
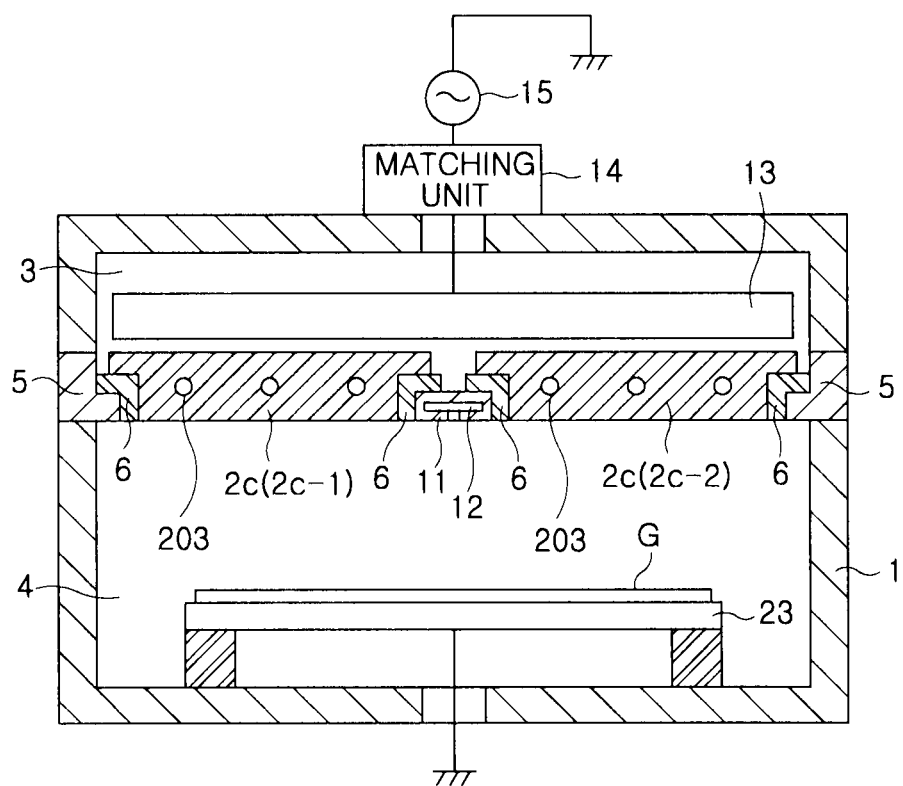
FIG. 13 is a schematic cross sectional view of an example of a metal window used in an inductively coupled plasma processing apparatus in accordance with a third embodiment of the present invention.

FIG. 13 is a schematic cross sectional view of an example of a metal window used in an inductively coupled plasma processing apparatus in accordance with a third embodiment of the present invention.

As shown in FIG. 13, a temperature control passage 203 is formed in a metal window 2*c* used in the inductively coupled plasma processing apparatus in accordance with the third embodiment. Since the metal window 2*c* has better processability compared to a dielectric window made of, e.g., quartz or ceramic, as described above, the temperature control passage 203 can be formed in the metal window 2*c*. Accordingly, it is possible to control the temperature of the metal window 2*c*, which was not possible in a dielectric window.

As such, in the inductively coupled plasma processing apparatus in accordance with the third embodiment, the metal window 2*c* is provided with the temperature control passage 203, for example. Accordingly, in addition to the effect of the first embodiment, the temperature of the metal window 2*c* is controlled such that the temperature is uniformly distributed over the metal window 2*c*, for example. By controlling the temperature of the metal window 2*c* uniformly, it becomes easy to perform a process on the target substrate more uniformly.

Further, although it is not shown, the temperature control passage 203 can be employed to a metal window 2*c* formed of a single plate, and can also be used together with the gas channel 12 and the gas injection openings 12*a* described in the second embodiment.

(Fourth Embodiment)

Figure 14:
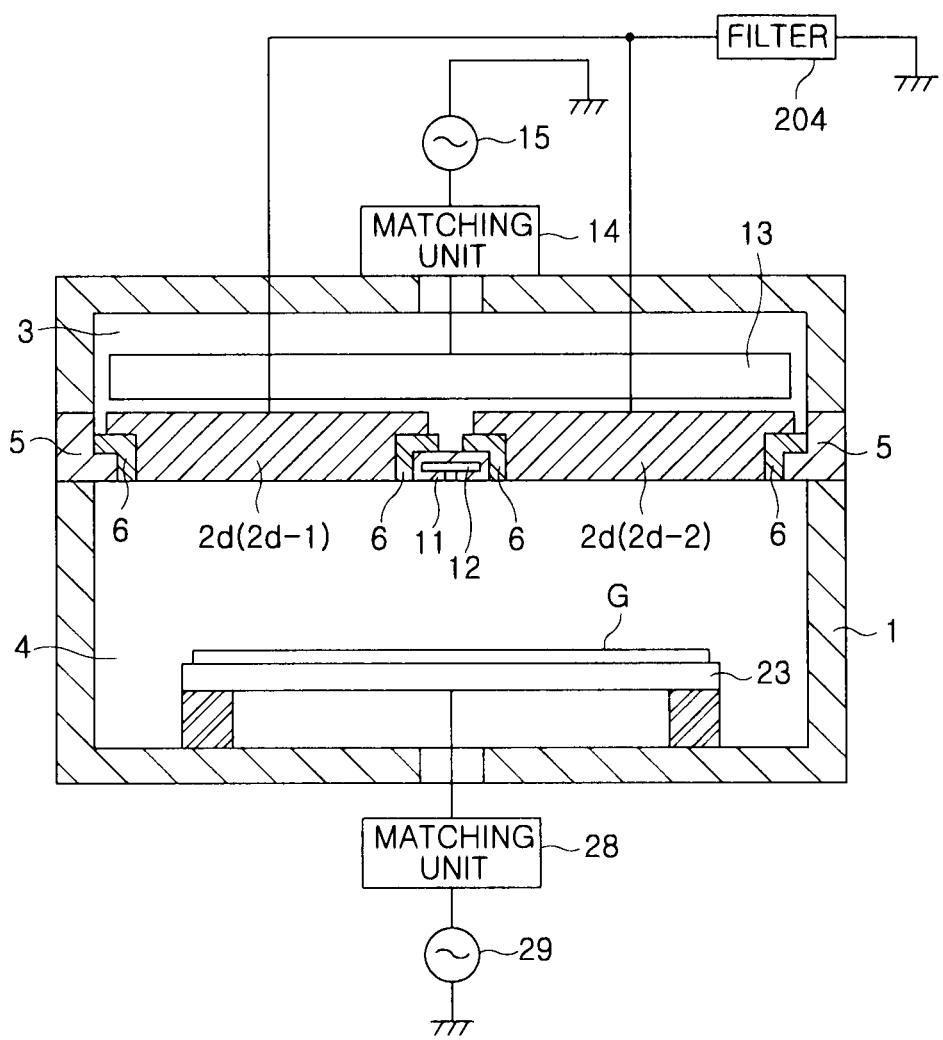
FIG. 14 is a schematic cross sectional view of an example of a metal window used in an inductively coupled plasma processing apparatus in accordance with a fourth embodiment of the present invention.

FIG. 14 provides a schematic cross sectional view of an example of a metal window used in an inductively coupled plasma processing apparatus in accordance with a fourth embodiment of the present invention.

As shown in FIG. 14, a metal window 2*d* used in the inductively coupled plasma processing apparatus in accordance with the fourth embodiment is grounded via a filter 204 for passing therethrough only the high frequency power of the second high frequency power supply 29 connected to the mounting table 23. Further, the metal window 2*d* functions as a facing electrode facing the mounting table 23 serving as a lower electrode connected to the second high frequency power supply 29. The metal window 2*d* is made of a nonmagnetic and conductive material, and thus can be used as a facing electrode.

The metal window 2*d* functions as the facing electrode facing the mounting table 23, which is the lower electrode, so that the adhesion of deposits to the window can be suppressed unlike in the case of using a dielectric window.

This is because, when the metal window 2*d* functions as the facing electrode, an electric field can be generated in a direction perpendicular to the bottom surface of the metal window 2*d*. Due to the generation of the electric field, the adhesion of deposits can be suppressed.

As such, in the inductively coupled plasma processing apparatus in accordance with the fourth embodiment, the metal window 2*d* serves as the facing electrode, for example. Hence, it becomes easy to obtain, in addition to the effect of the first embodiment, the effect in which the adhesion of deposits to the metal window 2*d* can be suppressed; further, the target substrate G can be processed under clean conditions; and labor-saving in maintenance works can be achieved. Moreover, the metal window 2*d* functions as an anode electrode with respect to the second high frequency power supply 29 connected to the mounting table 23 serving as the lower electrode. Accordingly, the area of the anode electrode for the second high frequency power supply increases compared to the conventional inductively coupled plasma processing apparatus. Due to the increase in the ratio of the area of the anode electrode to that of the cathode electrode, the self-bias voltage (Vdc) increases, and/or the plasma becomes uniform.

Further, although it is not shown, the fourth embodiment can be applied to a metal window 2*c* formed of a single plate, and can also be used together with the second and the third embodiment.

(Fifth Embodiment)

In the first to the fourth embodiment, the four metal windows 2-1 to 2-4 are mounted on the supporting shelf 5 and the supporting beam 11 via the insulators 6, so that the metal windows 2-1 to 2-4 are insulated from the supporting shelf 5, the supporting beam 11 and the main body 1. Further, the metal windows 2-1 to 2-4 are insulated from each other. Hence, the high-density inductively coupled plasma (ICP) can be generated.

The inductive electric field is formed in a horizontal direction with respect to the metal windows 2-1 to 2-4, so that a vertical electric field is hardly generated. As a consequence, the reaction products are easily adhered to the metal windows 2-1 to 2-4, and particles are easily generated.

To that end, the fifth embodiment provides the inductively coupled plasma processing apparatus capable of removing reaction products adhered to the metal windows 2-1 to 2-4.

Figure 15:
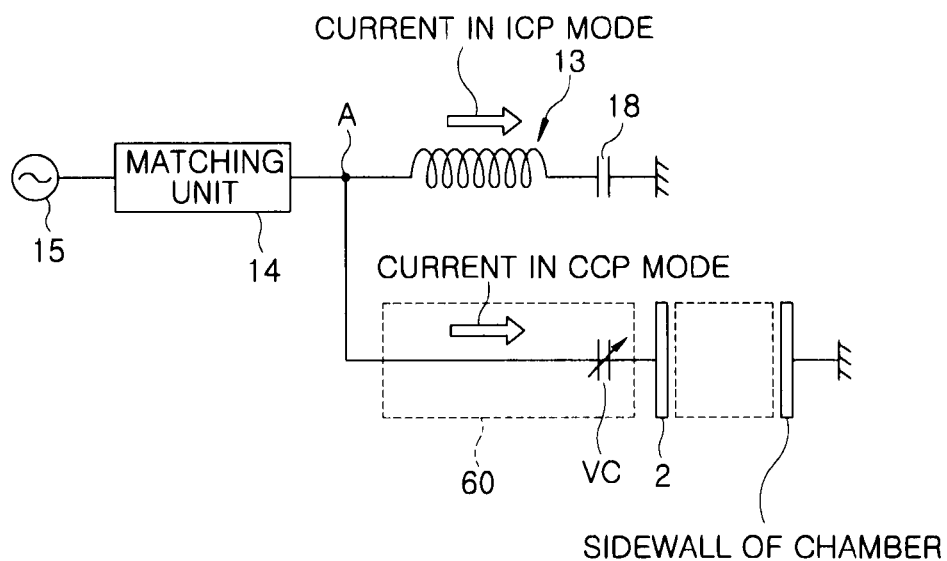
FIG. 15 is a circuit diagram showing an example of a capacitively coupled mode circuit used in an inductively coupled plasma processing apparatus in accordance with a fifth embodiment of the present invention.

FIG. 15 is a circuit diagram showing an example of a capacitively coupled mode circuit used in the inductively coupled plasma processing apparatus in accordance with the fifth embodiment of the present invention.

As shown in FIG. 15, a capacitively coupled mode circuit 60 has a variable capacitor VC having one terminal connected to a connection node A between the high frequency antenna 13 and a matching box (impedance matching unit) 14 and the other terminal connected to the metal window 2.

In the fifth embodiment, an inductively coupled plasma mode (ICP mode) and a capacitively coupled plasma mode (CCP mode) can be switched from one to another by controlling the capacitance of the variable capacitor VC.

Figure 16:
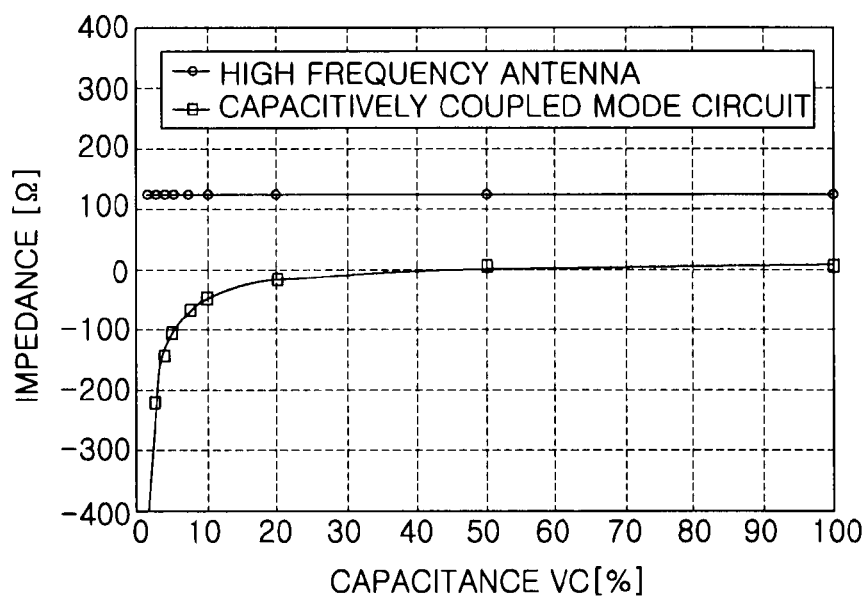
FIG. 16 describes a relationship between capacitance of a variable capacitor and respective impedances of a high frequency antenna circuit and a capacitively coupled mode circuit.

FIG. 16 shows a relationship between the capacitance of the variable capacitor and respective impedances of the high frequency antenna 13 and the capacitively coupled mode circuit 60.

As illustrated in FIG. 16, when the variable capacitor VC has a low capacitance, the impedance of the capacitively coupled mode circuit 60 becomes large negative value (large capacitive value). Therefore, the current flows through the high frequency antenna 13 having a low impedance, and the plasma processing apparatus mainly operates in the ICP mode.

On the contrary, when the variable capacitance VC has a high capacitance, the impedance of the capacitively coupled mode circuit 60 is almost zero. For that reason, the current flows through the metal window 2 via the capacitively coupled mode circuit 60, and the plasma processing apparatus mainly operates in the CCP mode.

Figure 17:
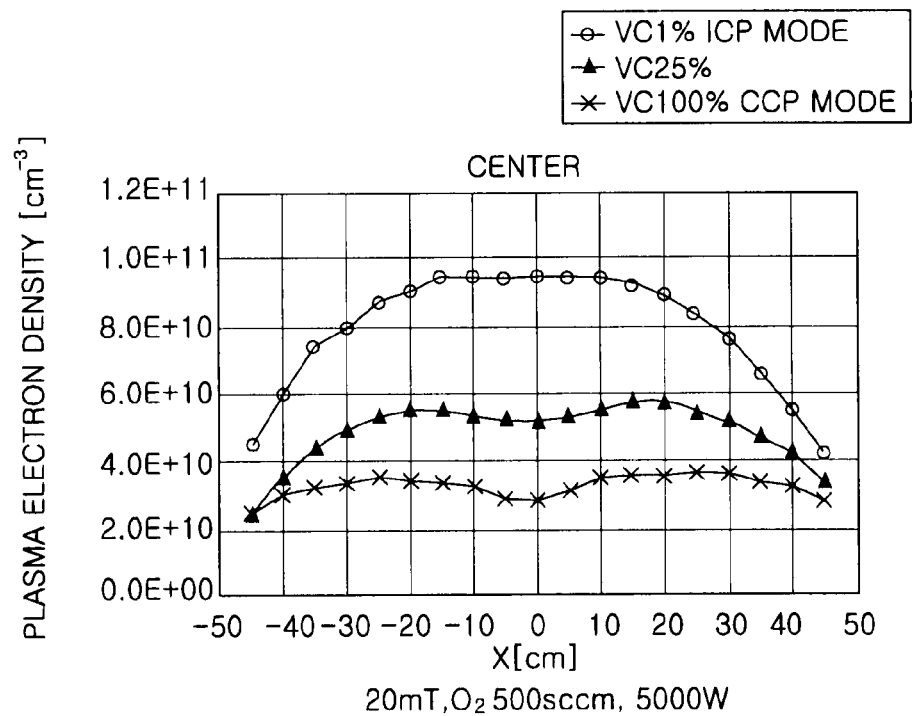
FIG. 17 shows plasma electron density distribution.

FIG. 17 depicts the plasma electron density distribution.

As shown in FIG. 17, when the capacitance is low (VC1%), the current flows through the high frequency antenna 13, so that the high-density inductively coupled plasma (ICP) is generated.

On the other hand, when the capacitance is high (VC100%), the current flows through the metal window 2, so that the capacitively coupled plasma (CCP) is generated between an upper electrode, e.g., the metal window 2, and a facing electrode, e.g., a sidewall of the processing chamber 4 or the mounting table (lower electrode) 23.

Figure 18:
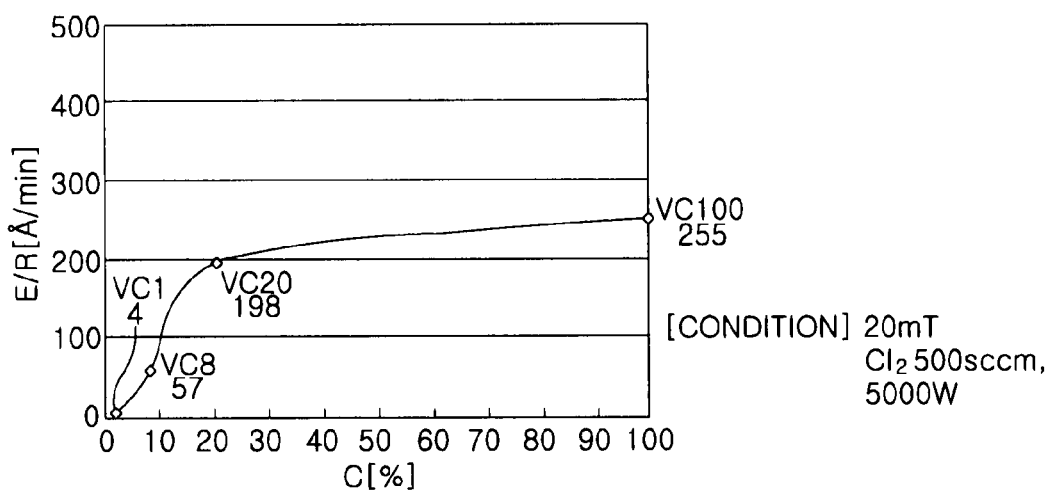
FIG. 18 illustrates the amount of abrasion of an SiO film adhered onto a surface of a metal window 2 which is exposed to a process chamber 4.

FIG. 18 depicts the amount of abrasion of an SiO film adhered to the surface of the metal window 2 which is exposed to the processing chamber 4. Although a Cl plasma is generated in the processing chamber 4 by supplying Cl gas into the processing chamber 4, the etching rate of the SiO film increases as the vertical electric field increases.

As can be seen from FIG. 18, the amount of abrasion of the SiO film decreases in the ICP mode (VC1%) and increases in the CCP mode (VC100%).

As such, in accordance with the fifth embodiment, the plasma processing apparatus can operate either in the ICP mode or the CCP mode due to the presence of the capacitively coupled mode circuit 60 including the variable capacitor VC having one terminal connected to the connection node A between the high frequency antenna 13 and the matching box (impedance matching unit) 14 and the other terminal connected to the metal window 2. Further, the plasma processing apparatus can operate in a mixed plasma mode in which the inductively coupled plasma mode (ICP mode) and the capacitively coupled plasma mode (CCP mode) are mixed at a certain ratio by appropriately varying the capacitance of the variable capacitance VC.

During the normal substrate processing, the plasma processing apparatus operates in the ICP mode, so that the substrate can be processed by the high-density plasma. When the deposits are adhered to the metal window 2, the plasma processing apparatus operates in the CCP mode. Therefore, the deposits adhered to the metal window 2 can be etched, and the metal window 2 can be cleaned.

In accordance with the fifth embodiment, it is possible to obtain, in addition to the effect of the first to the fourth embodiment, the effect in which the generation of particles during the normal substrate processing can be suppressed by cleaning the metal window 2.

(Sixth Embodiment)

Figure 19A:
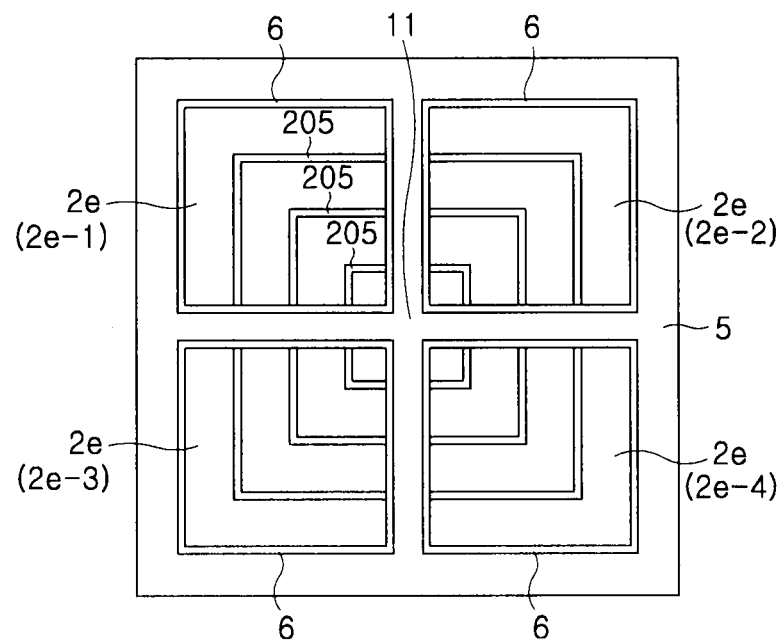
FIG. 19A is a top view of an example of a metal window used in an inductively coupled plasma processing apparatus in accordance with a sixth embodiment of the present invention.
Figure 19B:
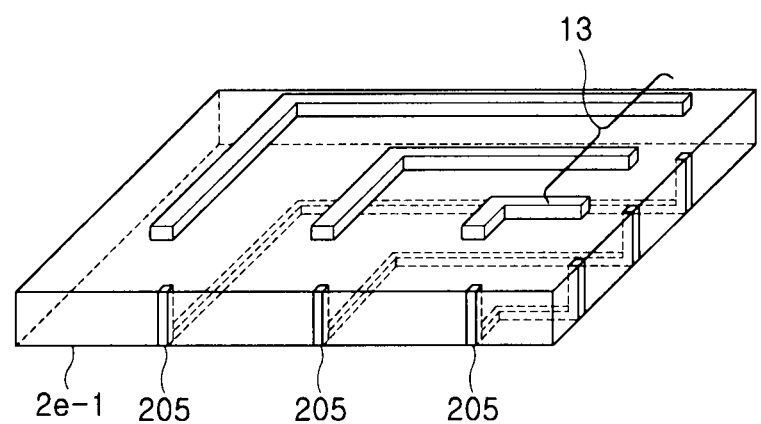
FIG. 19B is a perspective view of the metal window shown in FIG. 19A.

FIG. 19A shows a plane view of an example of a metal window used in an inductively coupled plasma processing apparatus in accordance with a sixth embodiment of the present invention, and FIG. 19b is a perspective view of the metal window shown in FIG. 19A.

As depicted in FIGS. 19A and 19B, in the inductively coupled plasma processing apparatus in accordance with the sixth embodiment of the present invention, a metal window 2e has on a side surface thereof and a surface exposed to the processing chamber 4 a conductive film 205 made of a non-magnetic conductive material having a conductivity higher than that of a material forming the metal window 2e. Further, the nonmagnetic conductive film 205 is formed in a wiring shape to determine a direction of an inductive electric field generated in the processing chamber 4.

In the first embodiment, a path of the eddy current $I_{LOOP}$ flowing through the bottom surface (the surface exposed to the processing chamber) of the metal window is a minimum path. This is because the conductivity of the surface of the metal window is uniform. Herein, the path of the eddy current $I_{LOOP}$ flowing through the bottom surface of the metal window 2e can be determined by forming the nonmagnetic and conductive film 205 having a conductivity higher than that of a material forming the metal window 2e. By determining the path of the eddy current $I_{LOOP}$ flowing on the bottom surface of the metal window 2e, the direction of the inductive electric field generated in the processing chamber 4 can be determined.

In the example shown in FIGS. 19A and 19B, the metal window 2e is divided into metal windows 2e-1 to 2e-4, and the film 205 is formed in a dogleg shape on each of the metal windows 2e-1 to 2e-4, so that the path of the eddy current $I_{LOOP}$ is formed in a rectangular path as a whole. In that case, an inductive electric field circulating in a rectangular shape is generated in the processing chamber 4.

In such a case, if a plane of a target substrate to be processed G is, e.g., a rectangular shape, the rectangular inductive electric field can be uniformly generated thereon. Accordingly, it can facilitate to uniformly process the target substrate G having a rectangular shaped plane.

Although it is not illustrated, when the film 205 is formed in a circular arc shape on each of the divided metal windows 2e-1 to 2e-4, the path of the eddy current $I_{LOOP}$ is formed in a circular shape as a whole. In that case, an inductive electric field circulating in a circular shape is generated in the processing chamber 4.

For example, if a plane of a target substrate to be processed G is a circular shape, the circular inductive electric field can be uniformly generated thereon. Hence, it becomes easy to uniformly process the target substrate G having a circular shape.

Moreover, the film 205 may be made of copper or alloy containing copper, or silver or alloy containing silver when the metal windows 2e-1 to 2e-4 are made of aluminum or alloy containing aluminum.

As such, in accordance with the inductively coupled plasma processing apparatus in accordance with the sixth embodiment, the wiring-shaped film 205 is formed on the bottom surface of the metal window 2e. Therefore, in addition to the effect of the first embodiment, the shape of the inductive electric field generated in the processing chamber 4 can be changed in accordance with various shapes of the target substrate G. As a result, it becomes easy to uniformly process the target substrate.

In addition, although it is not shown, the sixth embodiment can be used together with the second to the fifth embodiment.

(Seventh Embodiment)

Figure 20:
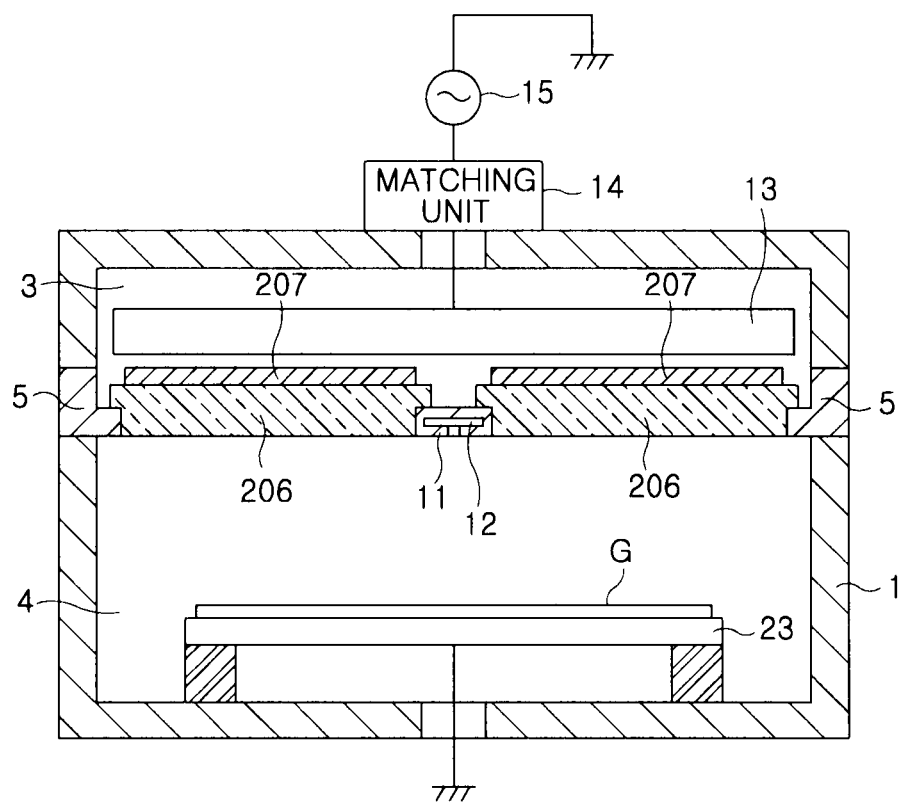
FIG. 20 is a schematic cross sectional view of an example of an inductively coupled plasma processing apparatus in accordance with a seventh embodiment of the present invention.

FIG. 20 is a schematic cross sectional view of an example of an inductively coupled plasma processing apparatus in accordance with a seventh embodiment of the present invention.

As shown in FIG. 20, in the inductively coupled plasma processing apparatus in accordance with the seventh embodiment, a metal plate 207 is formed on a dielectric window 206.

In this example, the dielectric window 206 is divided into, e.g., four rectangular sections, (only two being shown among the four dielectric windows 206) as shown in FIG. 2, and the four metal plate 207 are fixed onto the four dielectric windows 206 respectively while being insulated from each other.

Figure 21:
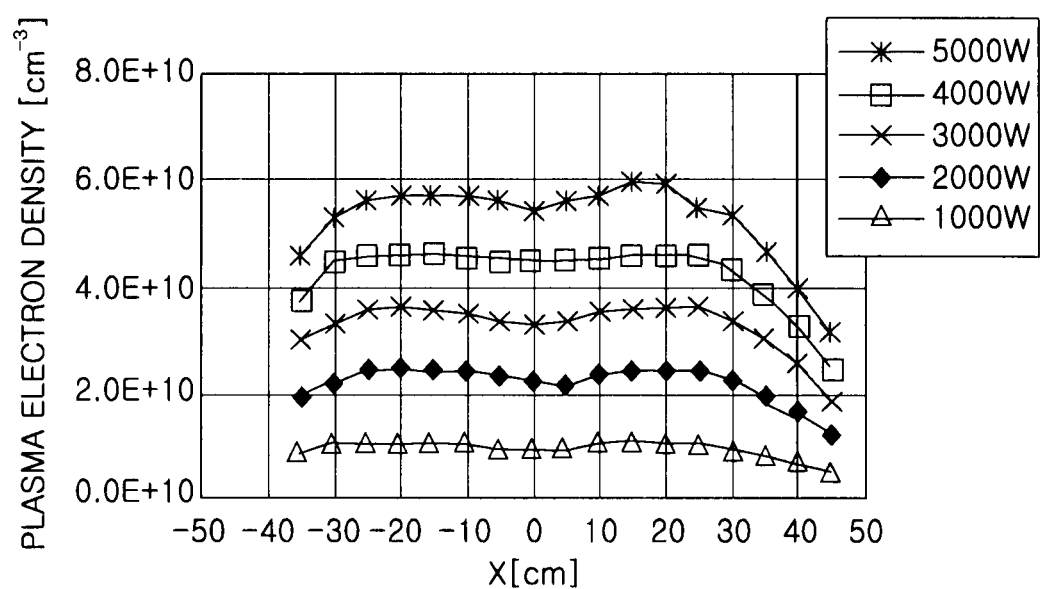
FIG. 21 illustrates a plasma electron density obtained in the inductively coupled plasma processing apparatus in accordance with the seventh embodiment.

FIG. 21 illustrates the plasma density obtained from the inductively coupled plasma processing apparatus shown in FIG. 20.

As can be seen from FIG. 21, a high-density plasma can be generated by the inductively coupled plasma processing apparatus in accordance with the seventh embodiment as well as the inductively coupled plasma processing apparatus in accordance with the first embodiment.

In the inductively coupled plasma processing apparatus in accordance with the seventh embodiment, the metal plate 207 is fixed on the dielectric window 206. In that case, the hardness of the dielectric window 206 can be increased compared to the case where the metal plate 207 is not provided. As a result, the same effect as the first embodiment can be obtained.

The dielectric window 206 is made of quartz or ceramic. An example of the ceramic is alumina ceramic.

Moreover, the metal plate 207 is made of, e.g., aluminum or alloy containing aluminum.

As described above, in accordance with the embodiments of the present invention, the inductively coupled plasma processing apparatus is provided to deal with a target substrate to be processed in a larger size.

The present invention can be variously modified without being limited to the above embodiments.

For example, a structure of the high frequency antenna is not limited to one described in the above embodiments. Various structures can be employed as long as an inductive electric field can be generated in the processing chamber.

Although the nonmagnetic and conducive metal window is divided into four rectangular sections or four triangular sections in the above-described embodiments, the number of division is not limited thereto, and may be arbitrary. It may also be divided into, e.g., 9, 16, rectangular sections, or 8, . . . triangular sections.

In the above embodiments, an ashing apparatus is used as an example of an inductively coupled plasma processing apparatus. However, it is not limited to the ashing apparatus, and may also be applied to another plasma processing apparatus for performing etching, CVD film formation or the like.

In the above-described embodiments, an FPD substrate is used as a target substrate to be processed. However, the present invention is not limited thereto, and can also be applied to processing of another substrate such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. An inductively coupled plasma processing apparatus comprising:
    a processing chamber for accommodating a target substrate to be processed and performing plasma processing thereon;
    a mounting table provided in the processing chamber, for mounting thereon the target substrate;
    a processing gas supply system for supplying a processing gas into the processing chamber;
    a gas exhaust system for exhausting the inside of the processing chamber;
    a high frequency antenna for forming an inductive electric field in the processing chamber;
    a first high frequency power supply for supplying a high frequency power to the high frequency antenna,
    wherein a metal window made of a nonmagnetic and conductive material is formed between the high frequency antenna and the processing chamber while being insulated from a main body which forms the processing chamber, and
    wherein the metal window is divided into multiple sections insulated from each other by insulators.

2. The inductively coupled plasma processing apparatus of claim 1, wherein the high frequency antenna has a spiral plane shape or an annular plane shape, and the metal window is divided along lines extending radially from a center of the spiral plane shaped antenna or the annular plane shaped antenna.

3. The inductively coupled plasma processing apparatus of claim 2, wherein when a wall of the processing chamber which faces oppositely to the mounting table has a rectangular shape, the metal window is divided along lines for connecting a center of the rectangular shaped wall with middle points of sides of the rectangular shaped wall.

4. The inductively coupled plasma processing apparatus of claim 2, wherein when a wall of the processing chamber which faces oppositely to the mounting table has a rectangular shape, the metal window is divided along lines for connecting a center of the rectangular shaped wall and corners of the rectangular shaped wall.

5. The inductively coupled plasma processing apparatus of claim 1, wherein a dielectric film is formed on a surface of the metal window.

6. The inductively coupled plasma processing apparatus of claim 5, wherein the dielectric film is formed of an anodic oxide film or a thermally sprayed ceramic film.

7. The inductively coupled plasma processing apparatus of claim 1, wherein a dielectric cover is provided on the surface of a metal window which is exposed to the processing chamber.

8. The inductively coupled plasma processing apparatus of claim 7, wherein the dielectric cover is made of quartz or ceramic.

9. The inductively coupled plasma processing apparatus of claim 1, wherein a nonmagnetic conductive film having a conductivity higher than a conductivity of a material forming the metal window is formed on the surface of a metal window.

10. The inductively coupled plasma processing apparatus of claim 9, wherein the nonmagnetic conductive film is formed on a side surface of the metal window and a surface of the metal window exposed to the processing chamber in a wiring shape to determine a direction of an inductive electric field generated in the processing chamber.

11. The inductively coupled plasma processing apparatus of claim 9, wherein the metal window is made of aluminum or alloy containing aluminum, and the nonmagnetic conductive film is made of copper or alloy containing copper, or silver or alloy containing silver.

12. The inductively coupled plasma processing apparatus of claim 1, further comprising a second high frequency power supply for supplying a high frequency power to the mounting table, wherein the metal window is grounded via a filter for passing therethrough only a high frequency power of the second high frequency power supply.

13. The inductively coupled plasma processing apparatus of claim 1, wherein a temperature control passage is formed in the metal window.

14. The inductively coupled plasma processing apparatus of claim 1, wherein gas injection openings for injecting the processing gas are formed in the metal window.

15. The inductively coupled plasma processing apparatus of claim 14, wherein the metal window includes a base having a recessed portion serving as a gas channel; and a shower plate having gas injection openings, and an electric contact member as a conductive member is provided in a surface on which the base and the shower plate are brought into contact with each other to electrically contact the main body and the shower plate.

16. The inductively coupled plasma processing apparatus of claim 1, further comprising a capacitively coupled mode circuit having a variable capacitor having one terminal connected to a connection node between the first high frequency power supply and the high frequency antenna while the other terminal is connected to the metal window.

* * * * *